(12) United States Patent
Park et al.

(10) Patent No.: US 6,742,151 B2
(45) Date of Patent: May 25, 2004

(54) SEMICONDUCTOR INTEGRATED CIRCUIT DEVICE WITH SCAN SIGNAL CONVERTING CIRCUIT

(75) Inventors: Hee-Min Park, Kyunggi-do (KR); Hong-Shin Jun, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 476 days.

(21) Appl. No.: 09/755,075

(22) Filed: Jan. 8, 2001

(65) Prior Publication Data

US 2001/0011361 A1 Aug. 2, 2001

(30) Foreign Application Priority Data

Jan. 28, 2000 (KR) .......................................... 2000-4378

(51) Int. Cl.[7] .......................... G01R 31/28; H04L 7/00; G06F 1/04
(52) U.S. Cl. .................... 714/729; 714/731; 713/401; 713/500
(58) Field of Search ........................ 714/30, 726, 727, 714/728, 729, 731, 798; 713/400, 401, 500

(56) References Cited

U.S. PATENT DOCUMENTS

| | | | | |
|---|---|---|---|---|
| 5,783,960 | A | | 7/1998 | Lackey ........................ 327/295 |
| 5,850,150 | A | | 12/1998 | Mitra et al. .................... 326/16 |
| 6,145,105 | A | * | 11/2000 | Nadeau-Dostie et al. ... 714/726 |
| 6,173,428 | B1 | * | 1/2001 | West ........................... 714/727 |
| 6,442,722 | B1 | * | 8/2002 | Nadeau-Dostie et al. ... 714/731 |
| 6,446,230 | B1 | * | 9/2002 | Chung ......................... 714/726 |
| 6,473,727 | B1 | * | 10/2002 | Kirsch et al. ................. 703/28 |

OTHER PUBLICATIONS

Article: Park, Heemin et al., "Test Ready Core Design For Teaklite Core", pp. 363–366, IEEE, 1999.
Article: "Scan Synthesis, Reference Manual Chapter 3: Choosing a Methodology and Scan Style", pp. 1–40, Version 2000. May 5, 2000.

* cited by examiner

Primary Examiner—Christine T. Tu
(74) Attorney, Agent, or Firm—Volentine Francos, PLLC

(57) ABSTRACT

A semiconductor integrated circuit including a plurality of cores and/or a plurality of user defined logic (UDL) circuits, also includes a scan signal converting circuit to generate a plurality of scan signals to test the cores and/or the circuits adopting various scan styles in core-based design. The scan signal converting circuit converts scan signals corresponding one of the scan styles into various scan signals to control shift and normal operation of the embedded plural cores and/or the UDL circuits. As a result, the integrated circuit having a plurality of cores and/or the UDL circuits can be tested by the generated various scan signals from the scan signal converting circuit, under control of the scan signals corresponding to one of the scan styles. Therefore, the integrated circuit can easily perform test algorithms such as automatic test-pattern generation (ATPG) algorithm, and the like.

21 Claims, 6 Drawing Sheets

SEMICONDUCTOR INTEGRATED CIRCUIT DEVICE WITH SCAN SIGNAL CONVERTING CIRCUIT

This application relies for priority upon Korean Patent Application No. 00-04378, filed on Jan. 28, 2000, the contents of which are herein incorporated by reference in their entirety.

BACKGROUND OF THE INVENTION

The present invention relates to a semiconductor integrated circuit device. More particularly, the present invention relates to a semiconductor integrated circuit device with a scan signal converting circuit for generating plural scan signals in response to scan signals corresponding to one of the scan styles. The plural scan signals are used for embedded circuits adopting various scan styles.

Recently, there have been an increasing number of core-based integrated circuit (IC) designs. This means that the use of system-on-a-chip (SOC) designs is generally recognized as a new design trend. As a result, a memory core or an analog core as well as a central processing unit (CPU) core is frequently used in IC design. In addition, there has been a tendency to invest an IC with plural and various kinds of cores.

In core design, a scan design is often adopted to insure testability. In such a scan design, a scan style is selected to have one of: a multiplexed-scan scan style, a clocked-scan scan style, or a level sensitive scan design (LSSD) scan style. The scan design may also be adopted in a full chip design to insure testability.

In full chip design, if a scan style for an embedded core is different from a scan style for a user defined logic (UDL), it is necessary to convert the test protocol of the core or the UDL to test the chip. An SOC test using automatic test-pattern generation (ATPG) algorithm can be easily performed if shift and normal operation of the core and the UDL is controlled by one of the test protocols.

For the SOC test, a well-prepared core, called a test ready core, provides an efficient test access scheme for the core as well as for the UDL. The test ready core also provides a test isolation capability to prevent any bus conflict during the SOC test. One example of the test ready core is set forth in a paper titled TEST READY CORE DESIGN FOR TEAK-LITE CORE, by Heemin Park et al. This paper was published in August, 1999 issue of First IEEE AP-ASIC, pages 363–366. The paper describes a method for testing the UDL and a shadow logic of the core by constructing an isolation ring in the core and using an ATPG algorithm. The isolation ring constructed in the core uses a scan style chosen from: the multiplexed-scan scan style, the clocked-scan scan style, and the LSSD scan style. These scan styles are described in more detail in "Synopsys, Scan Synthesis Reference Manual," version 2000.05, chapter 3, "Choosing a Methodology and Scan Style," pages 3-1 to 3-40, published in 2000.

In an SOC test, if the scan style for the core is different from the scan style for the UDL or other embedded core, it can be problematic to convert the test protocols of the core and the UDL to perform the ATPG algorithm. One way to solve this problem is shown in U.S. Pat. No. 5,850,150 to Mitra et al., issued in December, 1998, entitled "FINAL STAGE CLOCK BUFFER IN A CLOCKED DISTRUBUTION NETWORK." This design employs a buffer that receives an input scan signal and outputs a clock signal and a scan clock signal. In addition, another solution is shown in U.S. Pat. No. 5,783,960 to Lackey, issued in July, 1998, entitled "INTEGRATED CIRCUIT DEVICE WITH IMROVED CLOCK SIGNAL CONTROL," which uses an LSSD master/slave clock control method and related structure.

Recently, as the number of cores embedded in a given system have increased, the related SOC system has become more complex. Thus, various kinds of scan styles may be used in an SOC system. However, the methods described above are restricted to converting the test protocol from a clocked-scan scan style into a multiplexed-scan scan style, and operate only to control the LSSD clock signal. Therefore, a novel scan signal converting circuit is required that is capable of handling various kinds of scan styles to more easily and effectively test the SOC system.

SUMMARY OF THE INVENTION

It is therefore an object of the present invention to provide a scan signal converting circuit for generating a plurality of scan signals for embedded circuits that adopt various scan styles, in response to scan signals corresponding to one particular scan style.

In order to attain the above objects, and according to an aspect of the present invention, a semiconductor integrated circuit is provided that comprises a first logic block adopting a first scan style, having a plurality of first scan cells for testing the semiconductor integrated circuit; a second logic block adopting a second scan style, having a plurality of second scan cells for testing the semiconductor integrated circuit, the second scan style being different from the first scan style; a scan signal converting circuit coupled to the first and second logic blocks, for converting input scan signals for controlling the first logic block into first modified scan signals for controlling the second block, so as to control shift and normal operation of the first and second logic blocks.

Each of the first and second logic blocks is preferably either a core or a user defined logic. The first and second scan styles are preferably chosen from the group of: a clocked-scan scan style, a multiplexed-scan scan style, and a level sensitive scan design (LSSD) scan style.

The semiconductor integrated circuit may further comprise a third logic block adopting a third scan style, having a plurality of third scan cells for testing the semiconductor integrated circuit, the third scan style being different from the first and second scan styles. The scan signal converting circuit is preferably coupled to the third logic block, and converts the input scan signals for controlling the first logic block into second modified scan signals for controlling the third block, so as to control shift and normal operation of the third logic block.

The third logic block is preferably either a core or a user defined logic, and the third scan style is preferably chosen from the group of: a clocked-scan scan style, a multiplexed-scan scan style, and a level sensitive scan design (LSSD) scan style.

In accordance with another aspect of the invention, a semiconductor integrated circuit is provided that comprises a first logic block using a clocked-scan scan style and having a plurality of first scan cells; a second logic block using a multiplexed-scan scan style and having a plurality of second scan cells; a third logic block using a level sensitive scan design (LSSD) scan style and having a plurality of third scan cells; and a scan signal converting circuit coupled to the first through third logic blocks, for generating one or more first scan signals for controlling shift and normal operation of the first logic block, one or more second scan signals for controlling shift and normal operation of the second logic block, and one or more third scan signals for controlling shift and normal operation of the third logic block, all in response to input scan signals for the first logic block, so as to test the integrated circuit under control of the input scan signals.

The scan signal converting circuit preferably comprises: a first scan signal generating means for generating the one or more first scan signals for the first logic block and the one or more second scan signals for the second logic block, in response to the input scan signals; and second scan signal generating means for generating the one or more third scan signals for the third logic block in response to the one or more first scan signals.

The first scan signal generating means preferably comprises: a first delay for generating an output scan clock signal (SCK) for the first logic block, by delaying an input scan clock signal (SCK-IN) included in the input scan signals; a second delay for generating a system clock signal (CK) for the first logic block, by delaying an input system clock signal (CK-IN) included in the input scan signals; a latch circuit for latching the input system clock signal (CK-IN) and the input scan clock signal (SCK-IN) to generate a scan enable signal (SE) for the second logic block; and a multiplexer for generating a test clock signal (MCK) for the second logic block, by selecting either the system clock signal (CK) or the scan clock signal (SCK) in response to the scan enable signal (SE). The latch circuit is preferably an R-S latch.

The second scan signal generating means preferably comprises: a first two-phase clock generator for generating a first output clock signal as a master system clock signal (CK-MA1) for the third logic block, and a second output clock signal, wherein the first and the second output clock signals are two-phase non-overlapping clock signals; a second two-phase clock generator for generating a third output clock signal as a master shift clock signal (CK-MA2) for the third logic block, and a fourth output clock signal, wherein the third and the fourth output clock signals are two-phase non-overlapping clock signals; and slave clock signal generating means for generating a slave clock signal (CK-SL) for the third logic block in response to the third and the fourth output clock signals from the two-phase clock generators.

Preferably, the slave clock signal generating means comprises an AND gate, and the third and the fourth output signals are active high signals. However, the slave clock signal generating means may comprise an OR gate, and the third and the fourth output signals may be active low signals.

In accordance with yet another aspect of the invention, a semiconductor integrated circuit is provided that comprises a first logic block using a clocked-scan scan style and including a plurality of first scan cells; a second logic block using a multiplexed-scan scan style and including a plurality of second scan cells; a third logic block using a level sensitive scan design (LSSD) scan style and including a plurality of third scan cells; and a scan signal converting circuit coupled to the first through third logic blocks, for generating one or more first scan signals for controlling shift and normal operation of the first logic block, one or more second scan signals for controlling shift and normal operation of the second logic block, and one or more third scan signals for controlling shift and normal operation of the third logic block, all in response to input scan signals for the second logic block, so as to test the integrated circuit under control of the input scan signals.

The scan signal converting circuit preferably comprises: a two-phase clock generator for generating a first output clock signal, and a second output clock signal as a slave clock signal (CK-SL) for the third logic block, in response to an input test clock signal (MCK-IN) included in the input scan signals, wherein the first and the second output clock signals are two-phase non-overlapping clock signals; and a demultiplexer for generating a master system clock signal (CK-MA1) and a master shift clock signal (CK-MA2) for the third logic block, in response to the first output clock signal from the two-phase clock generator and an input scan enable signal (SE-IN) included in the input scan signals.

The input test clock signal (MCK-IN) is preferably the same as a test clock signal (MCK) for the second logic block, and the input scan enable signal (SE-IN) is preferably the same as a scan enable signal (SE) for the second logic block, respectively, without delaying. The master system clock signal (CK-MA1) is preferably the same as a system clock signal (CK) for the first logic block, and the master shift clock signal (CK-MA2) is preferably the same as a scan clock signal (SCK) for the first logic block.

In accordance with still another aspect of the invention, a semiconductor integrated circuit is provided that comprises a first logic block using a clocked-scan scan style and including a plurality of scan cells; a second logic block using a multiplexed-scan scan style and including a plurality of scan cells; third logic block using a level sensitive scan design (LSSD) scan style and including a plurality of scan cells; and a scan signal converting circuit coupled to the first through third logic blocks, for generating one or more first scan signals for controlling shift and normal operation of the first logic block, one or more second scan signals for controlling shift and normal operation of the second logic block, and one or more third scan signals for controlling shift and normal operation of the third logic block, all in response to input scan signals for the third logic block, so as to test the integrated circuit under control of the input scan signals.

The scan signal converting circuit preferably comprises: a first delay for generating a scan clock signal (SCK) for the first logic block and a master system clock signal (CK-MA1) for the third logic block, by delaying an input master system clock signal (CK-MA1-IN) included in the input scan signals; a second delay for generating a system clock signal (CK) for the first logic block and a master shift clock signal (CK-MA2) for the third logic block, by delaying an input master shift clock signal (CK-MA2-IN) included in the input scan signals; a third delay for generating a slave clock signal (CK-SL) for the third logic block, by delaying an input slave clock signal (CK-SL-IN) included in the input scan signals; a latch circuit for latching the input master system clock signal (CK-MA1-IN) and the input master shift clock signal (CK-MA2-IN), to generate a scan enable signal (SE) for the second logic block; and a multiplexer for generating a test clock signal (MCK) for the second logic block, by selecting either the master system clock signal (CK-MA1) or the master shift clock signal (CK-MA2), in response to the scan enable signal (SE).

The master system clock signal (CK-MA1) is preferably the same as the scan clock signal (SCK), and the master shift clock signal (CK-MA2) is preferably the same as the system clock signal (CK). The latch circuit is preferably an R-S latch.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings. In these drawings, like reference symbols indicate the same or similar components.

DESCRIPTION OF THE PREFERRED EMBODIMENT

Figure 1:
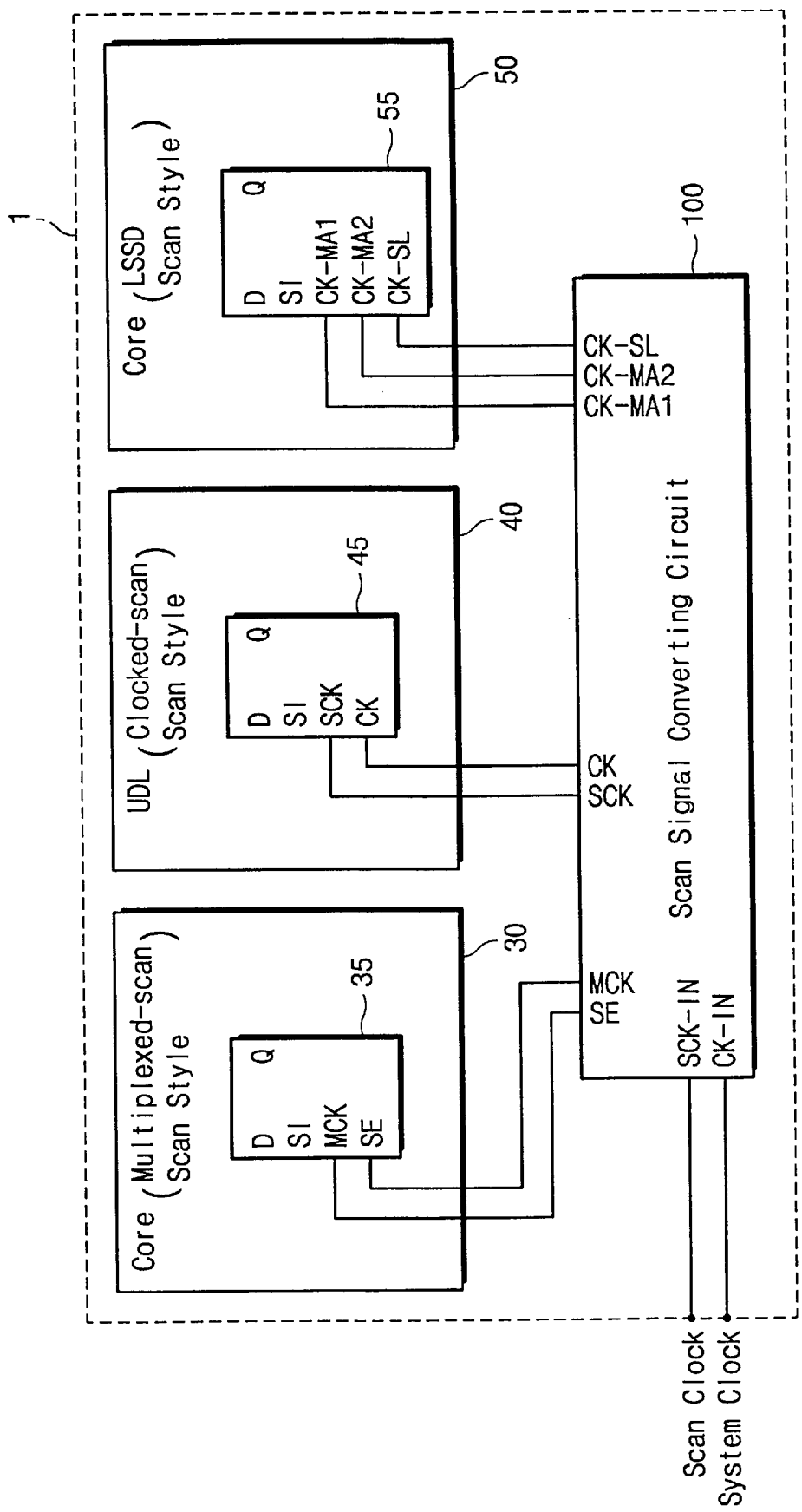
FIG. 1 is a block diagram showing an integrated circuit that includes a scan signal converting circuit according to a first preferred embodiment of the present invention.

FIG. 1 is a block diagram showing an integrated circuit 1 that includes a scan signal converting circuit 100 according to a first preferred embodiment of the present invention. As shown in to FIG. 1, an integrated circuit 1 comprises a first core 30, a user defined logic (UDL) 40, a second core 50, and a scan signal converting unit 100.

The first core 30 is designed to adopt a multiplexed-scan scan style; the UDL 40 is designed to adopt a clocked-scan scan style; and the second core 50 is designed to adopt an LSSD scan style. The cores 30 and 50 preferably have isolation rings (not shown) within the cores, to test the UDL 40. And the UDL 40 preferably includes a plurality of complementary circuits (not shown).

The cores 30 and 50 and the UDL 40 preferably include a plurality of scan cells to perform scan operations. By way of example, each flip-flop 35, 45, and 55 represents one of the scan cells included in the first core 30, the UDL 40, and the second core 55, respectively. It is understood that the first core 30, the UDL 40, and the second core 55, each will have more flip-flops 35, 45, and 55.

As shown in FIG. 1, the scan signal converting circuit 100 receives an input scan clock signals SCK-IN and an input system clock signal CK-IN, externally from the circuit 1, and outputs a plurality of scan signals internally to other parts of the circuit 1. The output scan signals include a test clock signal MCK, a scan enable signal SE, an output scan clock signal SCK, an output system clock signal CK, a master system clock signal CK-MA1, a master shift clock signal CK-MA2, and a slave system/shift clock signal CK-SL, which are used to control shift and normal operation of various of the scan cells 35, 45, and 55.

The test clock signal MCK and the scan enable signal SE are input to the scan cell 35 to perform a multiplexed-scan operation. The output scan clock signal SCK and the output system clock signal CK are input to the scan cell 45 to perform a clocked-scan operation. The master system clock signal CK-MA1, the master shift clock signal CK-MA2 and the slave system/shift clock signal CK-SL are input to the scan cell 55 to perform an LSSD scan operation.

The scan signal converting circuit 100 passes the input scan clock signal SCK-IN and the input system clock signal CK-IN on to the UDL 40 as the output scan clock signal SCK and the output system clock signal CK, respectively. The scan signal converting circuit 100 converts the input scan clock signal SCK-IN and the input system clock signal CK-IN into the output scan signals MCK, SE, CK-MA1, CK-MA2, and CK-SL for the first and the second cores 30 and 50. As a result, the first core cores 30, the UDL 40, and the second core 50, which are formed in the integrated circuit 1 and which adopt various scan styles, can be tested by the various scan signals from the scan signal converting circuit 100. This means that the integrated circuit 1 can more easily be tested by using an automatic test-pattern generation (ATPG) algorithm, or the like.

Figure 2:
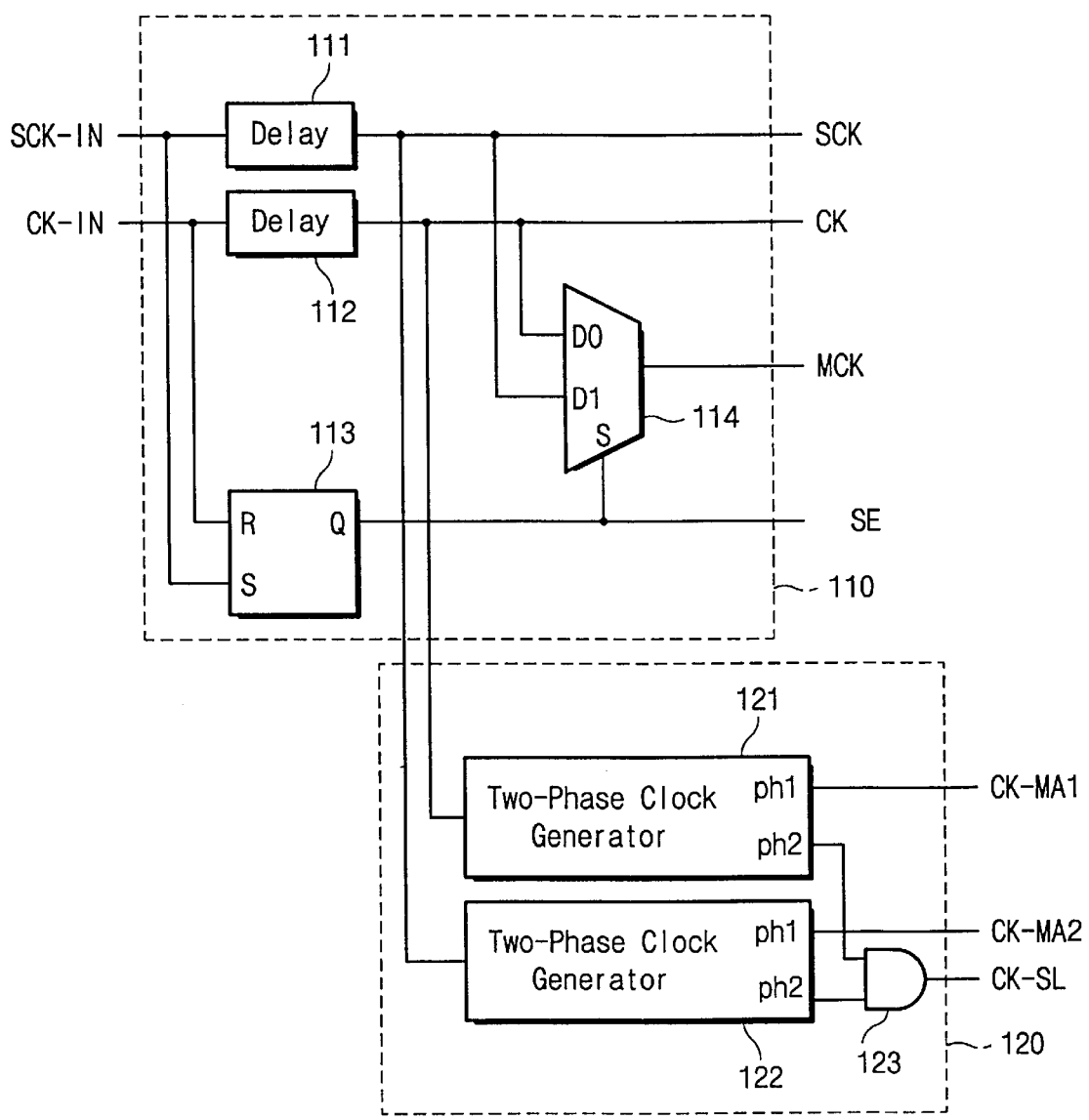
FIG. 2 is a circuit diagram showing a circuit construction of the scan signal converting circuit of FIG. 1.

FIG. 2 is a circuit diagram showing the scan signal converting circuit 100 of FIG. 1. As shown in FIG. 2, the scan signal converting circuit 100 includes a first scan signal converting circuit 110 for generating clocked scan signals and multiplexed scan signals, and a second scan signal converting circuit 120 for generating LSSD scan signals.

Figure 3:
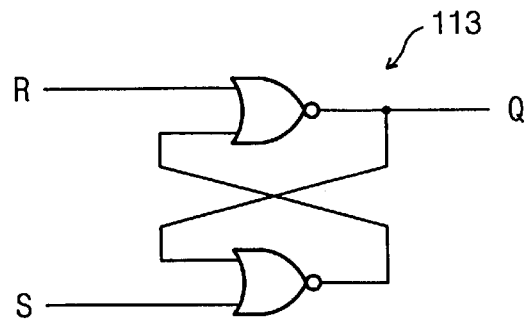
FIG. 3 is a detailed circuit diagram showing the R-S latch shown in FIG. 2.

The first scan signal converting circuit 110 includes first and second delays 111 and 112, an R-S latch 113, and a multiplexer 114. The first and second delays 111 and 112 are required to simultaneously use both the clocked scan signals and the multiplexed scan signals, in the integrated circuit 1. The first and second delays 111 and 112 can comprise a buffer or an inverter. The delay time of the first and second delays 111 and 112 is described in detail below. The R-S latch 113 may be constructed, for example, as shown in FIG. 3 by two NOR gates.

The second scan signal converting circuit 120 preferably comprises first and second two-phase clock generators 121 and 122, and an AND gate 123. The two-phase clock generators 121 and 122 are used to convert input scan signals into two-phase, non-overlapping clock signals.

Generally, the LSSD scan style second core 50 is designed based on a latch. As a result, two-phase non-overlapping clock signals are required for such a latch. In this embodiment, the AND gate 123 is used to generate the slave system/shift clock signal CK-SL. However, in alternate embodiments the AND gate 123 may be replaced with an OR gate when the output signals from the two-phase clock generators 121 and 122 are low-active signals.

In the first scan signal converting circuit 110, the input scan clock signal SCK-IN and the input system clock signal CK-IN are input to the first and second delays 111 and 112, respectively, and to the R-S latch 113. The input scan clock signal SCK-IN and the input system clock signal CK-IN are preferably provided from a source external to the circuit 1. The input scan clock signal SCK-IN and the input system clock signal CK-IN are preferably delayed by the first and second delays 111 and 112, and latched by the R-S latch 113.

The delayed clock signals from the first and second delays 111 and 112 are then input to the UDL 40 as the output scan clock signal SCK and the output system clock signal CK. The output scan clock signal SCK and the output system clock signal CK are also input to the multiplexer 114 to generate the test clock signal MCK that is used to perform the multiplexed-scan operation.

The latched signal from the R-S latch 113 is output to the multiplexer 114 as a selection signal S, and is also output to the core 30 as the scan enable signal SE that is used to perform the multiplexed-scan operation.

The multiplexer 114 actually generates the test clock signal MCK (which is provided to the first core 30) by selecting either the scan clock signal SCK or the system clock signal CK in response to the selection signal S from the R-S latch 113.

According to method described above, the scan signal converting circuit 100 generates the multiplexed scan signals MCK and SE in response to the input scan signals SCK-IN and CK-IN. As a result, the scan signal converting circuit 100 converts the test protocol for performing the clocked-scan operation into the test protocol for performing the multiplexed-scan operation.

In the second scan signal converting circuit 120, the scan clock signal SCK from the first delay 111 and the system clock signal CK from the second delay 112 are input to the first and second two-phase clock generators 121 and 122, respectively. A first output signal of the first two-phase clock generator 121 is input to the second core 50 as the master system clock signal CK-MA1, and a first output signal of the second two-phase clock generator 122 is input to the second core 50 as the master shift clock signal CK-MA2. Both the second output signals of the first and the second two-phase clock generator 121 and 122 are input to the AND gate 123 to generate the slave system/shift clock signal CK-SL, which is input to the second core 50.

According to method described above, the scan signal converting circuit 100 generates the LSSD scan signals CK-MA1, CK-MA2, and CK-SL in response to the input scan signals SCK-IN and CK-IN. As a result, the scan signal converting circuit 100 can convert the test protocol for performing the clocked-scan operation into the test protocol for performing the LSSD scan operation.

Figure 4:
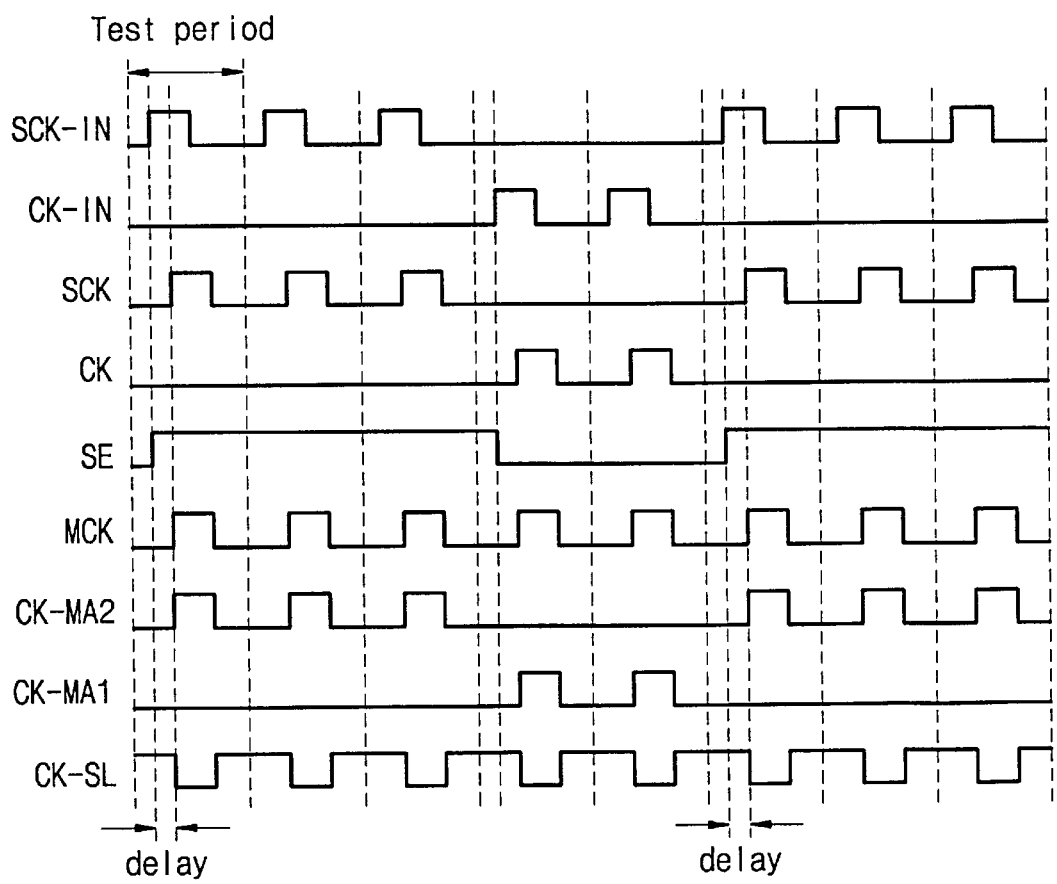
FIG. 4 is a timing diagram showing input and output scan signals of the scan signal converting circuit of FIG. 2.

FIG. 4 is a timing diagram showing the input and output scan signals of the scan signal converting circuit 100 shown in FIG. 2. As shown in FIG. 4, we can verify that the scan signal converting circuit 100 generates the multiplexed scan signals MCK and SE and the LSSD scan signals CK-MA1, CK-MA2, and CK-SL in response to the input scan signals SCK-IN and CK-IN. In other words, the output scan clock signal SCK and the output system clock signal CK are obtained by delaying the input scan clock signal SCK-IN and the input system clock signal CK-IN. The delay time is preferably chosen to be preferably longer than a hold time margin of the scan enable signal SE for the test clock signal MCK.

Figure 5:
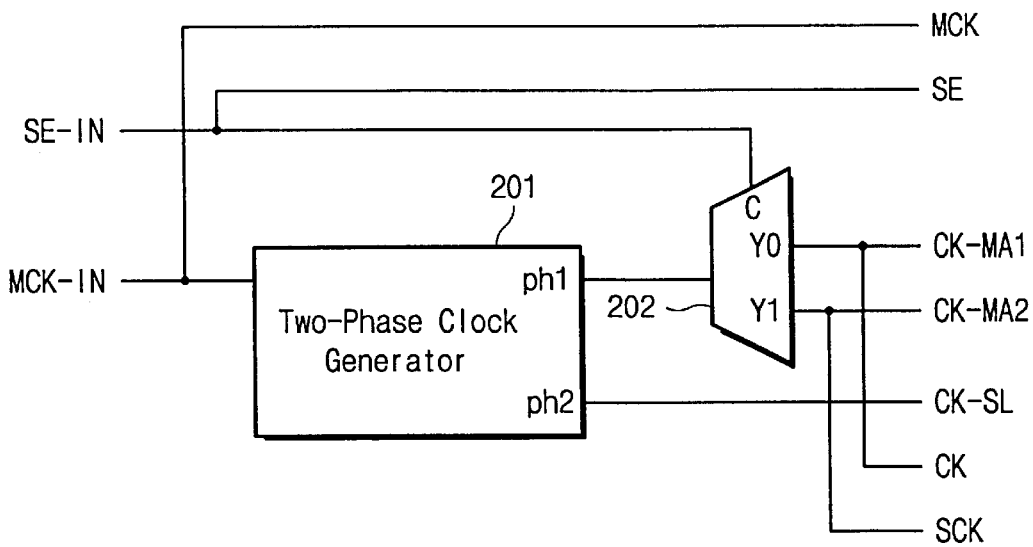
FIG. 5 is a circuit diagram showing a scan signal converting circuit according to a second preferred embodiment of the present invention.

FIG. 5 is a circuit diagram showing a scan signal converting circuit 200 according to a second preferred embodiment of the present invention. The scan signal converting circuit 200 converts an input test clock signal MCK-IN and an input scan enable signal SE-IN into clocked scan signals SCK and CK, and LSSD scan signals CK-MA1, CK-MA2, and CK-SL. As shown in FIG. 5, the scan signal converting circuit 200 preferably includes a two-phase clock generator 201 and a demultiplexer 202.

The input scan enable signal SE-IN and the input test clock signal MCK-IN are preferably passed directly on to the first core 30 as the scan enable signal SE and the test clock signal MCK without any delay.

When the input scan enable signal SE-IN and the input test clock signal MCK-IN are input externally to the scan signal converting circuit 200, the two-phase clock generator 201 generates two-phase non-overlapped clock signals in response to the input test clock signal MCK-IN. A first output signal of the two-phase clock generator 201 is input to the demultiplexer 202, and a second output signal of the two-phase clock generator 201 is input to a core or a UDL adopting the LSSD scan style as the slave system/shift clock signal CK-SL.

The demultiplexer 202 preferably outputs either the master system clock signal CK-MA1 or the master shift clock signal CK-MA2 in response to a control signal C. The input scan enable signal SE-IN is preferably used as the control signal C for the demultiplexer 202. The master system clock CK-MA1 is preferably used as the system clock signal CK of a core or a UDL adopting the clocked-scan scan style, and the master shift clock signal CK-MA2 is preferably used as the scan clock signal SCK of a core or a UDL adopting the clocked-scan scan style.

As described above, the scan signal converting circuit 200 generates the clocked scan signals SCK and CK, the multiplexed scan signals MCK and SE, and the LSSD scan signals CK-MA1, CK-MA2, and CK-SL in response to the input scan signals MCK-IN and SE-IN. Thus, the integrated circuit embedding cores and/or UDL circuits using various scan styles can be tested under control of the input scan signals MCK-IN and SE-IN.

Figure 6:
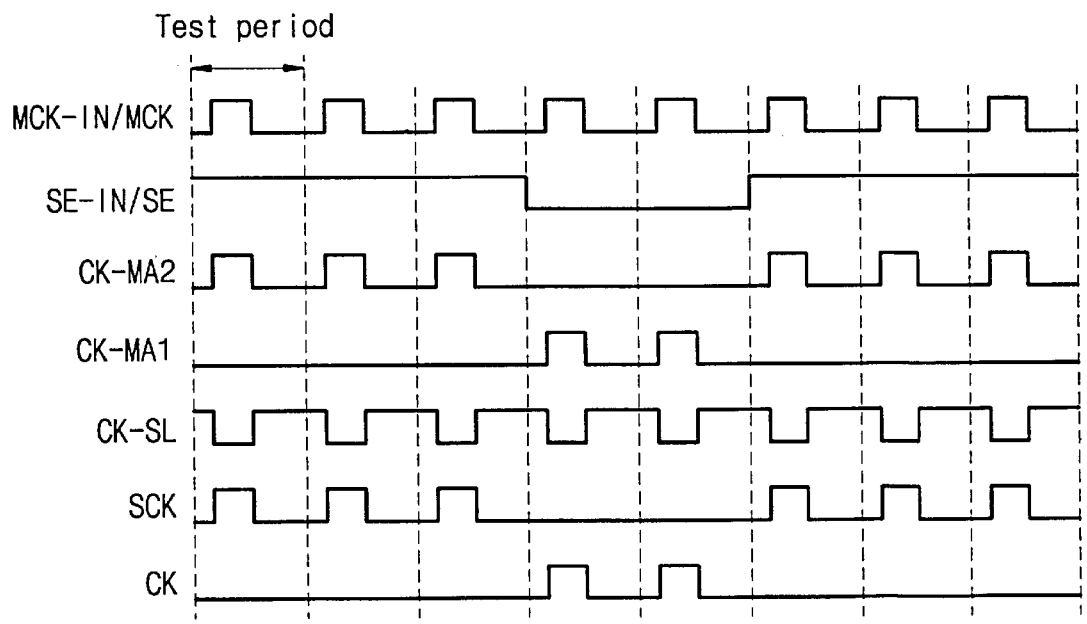
FIG. 6 is a timing diagram showing input and output scan signals of the scan signal converting circuit of FIG. 5.

FIG. 6 is a timing diagram showing input and output scan signals of the scan signal converting circuit 200 shown in FIG. 5. As shown in FIG. 6, the input scan enable signal SE-IN is the same as the scan enable signal SE, and the input test clock signal MCK-IN is the same as the test clock signal MCK, respectively. In addition, the master system clock signal CK-MA1 is the same as the system clock signal CK, and the master shift clock signal CK-MA2 is the same as the scan clock signal SCK.

Figure 7:
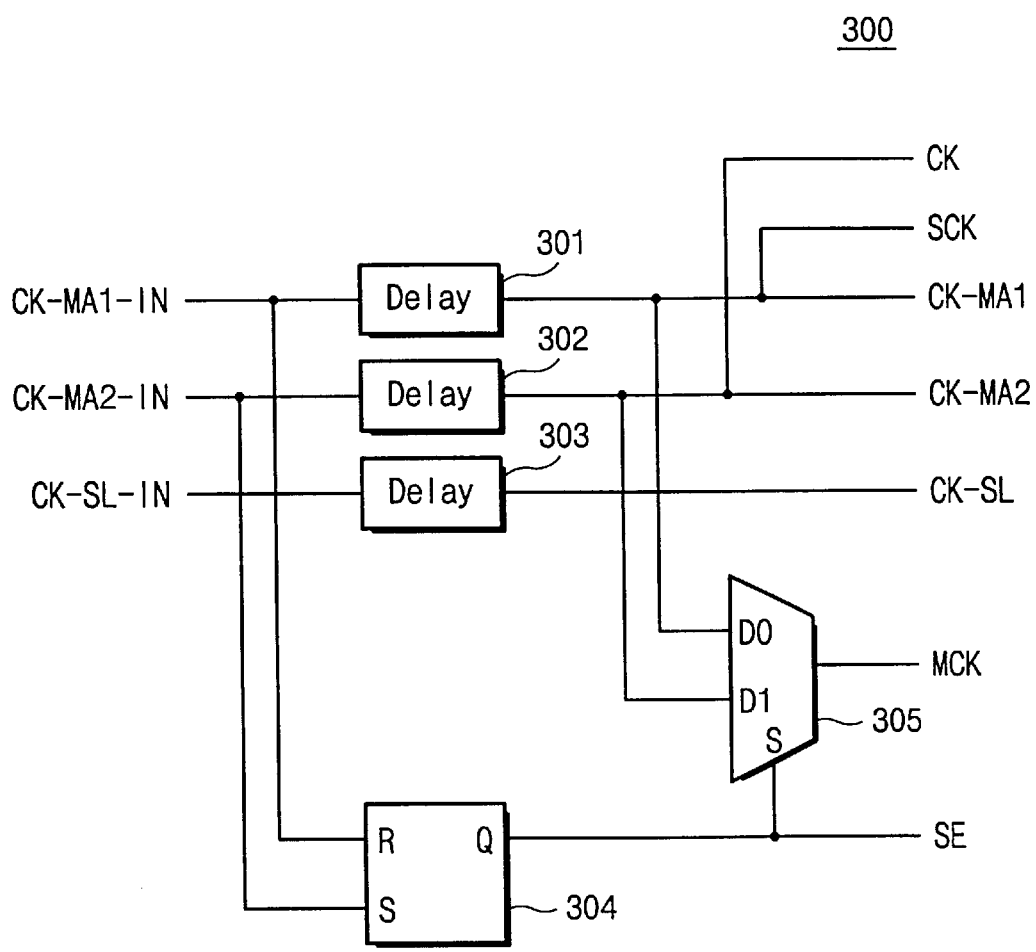
FIG. 7 is a circuit diagram showing a scan signal converting circuit according to a third preferred embodiment of the present invention.

FIG. 7 is a circuit diagram showing a scan signal converting circuit 300 according to a third preferred embodiment of the present invention. The scan signal converting circuit 300 converts input scan signals CK-MA1-IN, CK-MA2-IN, and CK-SL-IN into the clocked scan signals SCK and CK and the multiplexed scan signals MCK and SE.

As shown in FIG. 7, the scan signal converting circuit 300 includes three delays 301, 302, and 303, an R-S latch 304, and a multiplexer 305. The scan signal converting circuit 300 has the same arrangement as the first scan signal converting circuit 110 of the scan signal converting circuit 100 shown in FIG. 2, without a slave system/shift clock signal CK-SL. In other words, input scan signals CK-MA1-IN, CK-MA2-IN, and CK-SL-IN are scan signals for performing LSSD scan operation. This means that the input scan signals are classified to the input master clock signals CK-MA1-IN and CK-MA2-IN, and the input slave clock signal CK-SL-IN.

The delays 301, 302, and 303 are used to delay the input scan signals CK-MA1-IN, CK-MA2-IN, and CK-SL-IN, to generate both the multiplexed scan signals and the clocked scan signals, simultaneously, in the integrated circuit.

In order to convert the test protocol for performing the LSSD scan operation into the test protocol for performing the multiplexed-scan operation, the input master clock signals CK-MA1-IN and CK-MA2-IN are input externally to the delays 301 and 302, and to the R-S latch 304. The R-S latch 304 then generates the scan enable signal SE, by latching the input master clock signals CK-MA1-IN and CK-MA2-IN.

The delayed signals from the delays 301 and 302, i.e., the master system clock signal CK-MA1 and the master shift clock signal CK-MA2, are then input to the multiplexer 305. The multiplexer 305 outputs the test clock signal MCK by selecting either the master system clock signal CK-MA1 or the master shift clock signal CK-MA2, in response to a selection signal S from the R-S latch 304. Preferably, the scan enable signal SE from the R-S latch 304 is used as the selection signal S for the multiplexer 304. As a result, the scan signal converting circuit 300 converts the test protocol for performing the LSSD scan operation into the test protocol for performing the multiplexed-scan operation.

In addition, the scan signal converting circuit 300 generates the clocked scan signals CK and SCK by delaying the input master clock signals CK-MA1-IN and CK-MA2-IN. The delayed input master clock signals are also used as the master system clock signal CK-MA1 and the master shift clock signal CK-MA2 for performing the LSSD scan operation. In other words, the scan clock signal SCK is the same as the master system clock signal CK-MA1 and the system clock signal CK is the same as the master shift clock signal CK-MA2.

As described above, the scan signal converting circuit 300 converts the test protocol for performing the LSSD scan operation into the test protocol for performing the clocked-scan operation. As a result, the integrated circuit embedding cores and/or UDL circuits adopting various scan styles can be tested under control of the input scan signals CK-MA1-IN, CK-MA2-IN, and CK-SL-IN.

Figure 8:
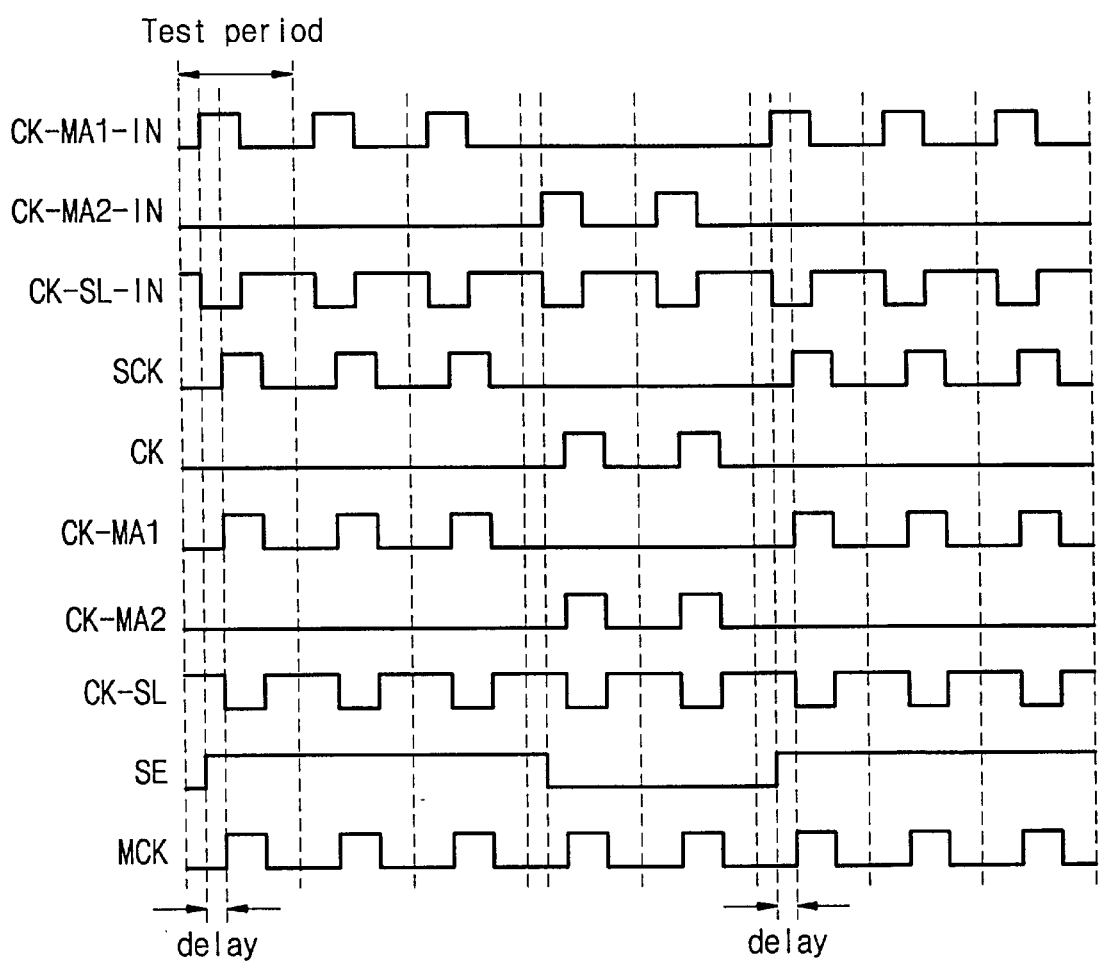
FIG. 8 is a timing diagram showing input and output scan signals of the scan signal converting circuit of FIG. 7.

FIG. 8 is a timing diagram showing input and output scan signals of the scan signal converting circuit 300 shown in FIG. 7. As shown in FIG. 8, the master system clock signal CK-MA1 is the same as the scan clock signal SCK, and the master shift clock signal CK-MA2 is the same as the system clock signal CK. In addition, a delay time is determined to be longer than a hold time margin of the scan enable signal SE for the test clock signal MCK, as is also shown in FIG. 4.

As described above, the scan signal converting circuit according to preferred embodiments of the present invention converts input scan signals corresponding to one of the scan styles into various scan signals to control shift and normal operation of the embedded plural cores and/or the UDL circuits. As a result, an integrated circuit having a plurality of cores and/or the UDL circuits can be tested by the various scan signals generated from the scan signal converting circuit, under control of the scan signals corresponding to one of the scan styles. Therefore, the integrated circuit can perform test algorithm, such as the automatic test-pattern generation (ATPG) algorithm, and so on, more easily.

While the invention has been described in terms of an exemplary embodiment, it is understood that it may be practiced as outlined above with modifications within the spirit and scope of the appended claims.

What is claimed is:

1. A semiconductor integrated circuit comprising:
    a first logic block adopting a first scan style, having a plurality of first scan cells for testing the semiconductor integrated circuit;
    a second logic block adopting a second scan style, having a plurality of second scan cells for testing the semiconductor integrated circuit, the second scan style being different from the first scan style;
    a scan signal converting circuit coupled to the first and second logic blocks, for converting input scan signals for controlling the first logic block into first modified scan signals for controlling the second block, so as to control shift and normal operation of the first and second logic blocks.

2. A semiconductor integrated circuit, as recited in claim 1, wherein each of the first and second logic blocks is either a core or a user defined logic.

3. A semiconductor integrated circuit, as recited in claim 1, wherein the first and second scan styles are chosen from the group of: a clocked-scan scan style, a multiplexed-scan scan style, and a level sensitive scan design (LSSD) scan style.

4. A semiconductor integrated circuit, as recited in claim 1, further comprising a third logic block adopting a third scan style, having a plurality of third scan cells for testing the semiconductor integrated circuit, the third scan style being different from the first and second scan styles,
    wherein the scan signal converting circuit is coupled to the third logic block, and converts the input scan signals for controlling the first logic block into second modified scan signals for controlling the third block, so as to control shift and normal operation of the third logic block.

5. A semiconductor integrated circuit, as recited in claim 4, wherein the third logic block is either a core or a user defined logic.

6. A semiconductor integrated circuit, as recited in claim 4, wherein the third scan style is chosen from the group of: a clocked-scan scan style, a multiplexed-scan scan style, and a level sensitive scan design (LSSD) scan style.

7. A semiconductor integrated circuit comprising:
    a first logic block using a clocked-scan scan style and having a plurality of first scan cells;
    a second logic block using a multiplexed-scan scan style and having a plurality of second scan cells;
    a third logic block using a level sensitive scan design (LSSD) scan style and having a plurality of third scan cells; and
    a scan signal converting circuit coupled to the first through third logic blocks, for generating one or more first scan signals for controlling shift and normal operation of the first logic block, one or more second scan signals for controlling shift and normal operation of the second logic block, and one or more third scan signals for controlling shift and normal operation of the third logic block, all in response to input scan signals for the first logic block, so as to test the integrated circuit under control of the input scan signals.

8. A semiconductor integrated circuit, as recited in claim 7, wherein the scan signal converting circuit comprises:
    a first scan signal generating means for generating the one or more first scan signals for the first logic block and the one or more second scan signals for the second logic block, in response to the input scan signals; and
    a second scan signal generating means for generating the one or more third scan signals for the third logic block in response to the one or more first scan signals.

9. A semiconductor integrated circuit, as recited in claim 8, wherein the first scan signal generating means comprises:
    a first delay for generating an output scan clock signal (SCK) for the first logic block, by delaying an input scan clock signal (SCK-IN) included in the input scan signals;
    a second delay for generating a system clock signal (CK) for the first logic block, by delaying an input system clock signal (CK-IN) included in the input scan signals;
    a latch circuit for latching the input system clock signal (CK-IN) and the input scan clock signal (SCK-IN) to generate a scan enable signal (SE) for the second logic block; and
    a multiplexer for generating a test clock signal (MCK) for the second logic block, by selecting either the system clock signal (CK) or the scan clock signal (SCK) in response to the scan enable signal (SE).

10. A semiconductor integrated circuit, as recited in claim 9, wherein the latch circuit is an R-S latch.

11. A semiconductor integrated circuit, as recited in claim 8, wherein the second scan signal generating means comprises:

a first two-phase clock generator for generating a first output clock signal as a master system clock signal (CK-MA1) for the third logic block, and a second output clock signal, wherein the first and the second output clock signals are two-phase non-overlapping clock signals;

a second two-phase clock generator for generating a third output clock signal as a master shift clock signal (CK-MA2) for the third logic block, and a fourth output clock signal, wherein the third and the fourth output clock signals are two-phase non-overlapping clock signals; and slave clock signal generating means for generating a slave clock signal (CK-SL) for the third logic block in response to the third and the fourth output clock signals from the two-phase clock generators.

12. A semiconductor integrated circuit, as recited in claim 11, wherein the slave clock signal generating means comprises an AND gate, and wherein the third and the fourth output signals are active high signals.

13. A semiconductor integrated circuit, as recited in claim 11, wherein the slave clock signal generating means comprises an OR gate, and wherein the third and the fourth output signals are active low signals.

14. A semiconductor integrated circuit comprising:

a first logic block using a clocked-scan scan style and including a plurality of first scan cells;

a second logic block using a multiplexed-scan scan style and including a plurality of second scan cells;

a third logic block using a level sensitive scan design (LSSD) scan style and including a plurality of third scan cells; and a scan signal converting circuit coupled to the first through third logic blocks, for generating one or more first scan signals for controlling shift and normal operation of the first logic block, one or more second scan signals for controlling shift and normal operation of the second logic block, and one or more third scan signals for controlling shift and normal operation of the third logic block, all in response to input scan signals for the second logic block, so as to test the integrated circuit under control of the input scan signals.

15. A semiconductor integrated circuit, as recited in claim 14, wherein the scan signal converting circuit comprises:

a two-phase clock generator for generating a first output clock signal, and a second output clock signal as a slave clock signal (CK-SL) for the third logic block, in response to an input test clock signal (MCK-IN) included in the input scan signals, wherein the first and the second output clock signals are two-phase non-overlapping clock signals; and a demultiplexer for generating a master system clock signal (CK-MA1) and a master shift clock signal (CK-MA2) for the third logic block, in response to the first output clock signal from the two-phase clock generator and an input scan enable signal (SE-IN) included in the input scan signals.

16. A semiconductor integrated circuit, as recited in claim 14, wherein the input test clock signal (MCK-IN) is the same as a test clock signal (MCK) for the second logic block, and the input scan enable signal (SE-IN) is the same as a scan enable signal (SE) for the second logic block, respectively, without delaying.

17. A semiconductor integrated circuit, as recited in claim 14, wherein the master system clock signal (CK-MA1) is the same as a system clock signal (CK) for the first logic block, and the master shift clock signal (CK-MA2) is the same as a scan clock signal (SCK) for the first logic block, respectively.

18. A semiconductor integrated circuit comprising:

a first logic block using a clocked-scan scan style and including a plurality of scan cells;

a second logic block using a multiplexed-scan scan style and including a plurality of scan cells;

a third logic block using a level sensitive scan design (LSSD) scan style and including a plurality of scan cells; and a scan signal converting circuit coupled to the first through third logic blocks, for generating one or more first scan signals for controlling shift and normal operation of the first logic block, one or more second scan signals for controlling shift and normal operation of the second logic block, and one or more third scan signals for controlling shift and normal operation of the third logic block, all in response to input scan signals for the third logic block, so as to test the integrated circuit under control of the input scan signals.

19. A semiconductor integrated circuit, as recited in claim 18, wherein the scan signal converting circuit comprises:

a first delay for generating a scan clock signal (SCK) for the first logic block and a master system clock signal (CK-MA1) for the third logic block, by delaying an input master system clock signal (CK-MA1-IN) included in the input scan signals;

a second delay for generating a system clock signal (CK) for the first logic block and a master shift clock signal (CK-MA2) for the third logic block, by delaying an input master shift clock signal (CK-MA2-IN) included in the input scan signals;

a third delay for generating a slave clock signal (CK-SL) for the third logic block, by delaying an input slave clock signal (CK-SL-IN) included in the input scan signals;

a latch circuit for latching the input master system clock signal (CK-CK-MA1-IN) and the input master shift clock signal (CK-MA2-IN), to generate a scan enable signal (SE) for the second logic block; and a multiplexer for generating a test clock signal (MCK) for the second logic block, by selecting either the master system clock signal (CK-MA1) or the master shift clock signal (CK-MA2), in response to the scan enable signal (SE).

20. A semiconductor integrated circuit, as recited in claim 19, wherein the master system clock signal (CK-MA1) is the same as the scan clock signal (SCK), and the master shift clock signal (CK-MA2) is the same as the system clock signal (CK).

21. A semiconductor integrated circuit, as recited in claim 19, wherein the latch circuit is an R-S latch.

* * * * *